(12) United States Patent
Raad

(10) Patent No.: US 7,023,756 B2
(45) Date of Patent: Apr. 4, 2006

(54) DRAM POWER BUS CONTROL

(75) Inventor: George B. Raad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/933,073

(22) Filed: Sep. 1, 2004

(65) Prior Publication Data

US 2005/0030818 A1 Feb. 10, 2005

Related U.S. Application Data

(62) Division of application No. 10/227,468, filed on Aug. 23, 2002, now Pat. No. 6,795,365.

(51) Int. Cl.
*G11C 11/00* (2006.01)

(52) U.S. Cl. ............... 365/226; 365/222; 365/228; 365/206

(58) Field of Classification Search ............... 365/226, 365/222, 228, 206
See application file for complete search history.

(56) References Cited

U.S. PATENT DOCUMENTS

| | | | |
|---|---|---|---|
| 4,748,494 A | 5/1988 | Yamada et al. | |
| 4,980,799 A | 12/1990 | Tobita | |
| 5,270,967 A * | 12/1993 | Moazzami et al. | 365/145 |
| 5,404,542 A | 4/1995 | Cheung | |
| 5,426,613 A * | 6/1995 | Takahashi et al. | 365/222 |
| 5,561,384 A * | 10/1996 | Reents et al. | 327/108 |
| 5,604,710 A | 2/1997 | Tomishima et al. | |
| 5,619,472 A * | 4/1997 | Okamura | 365/230.03 |
| 5,675,808 A * | 10/1997 | Gulick et al. | 713/322 |
| 5,701,597 A | 12/1997 | Nakanishi et al. | |
| 5,726,506 A | 3/1998 | Wood | |
| 5,814,851 A * | 9/1998 | Suh | 257/296 |
| 5,831,467 A * | 11/1998 | Leung et al. | 327/319 |
| 5,901,103 A | 5/1999 | Harris, II et al. | |
| 5,959,488 A | 9/1999 | Lin et al. | |
| 5,970,507 A * | 10/1999 | Kato et al. | 711/106 |
| 6,115,319 A * | 9/2000 | Kinoshita et al. | 365/233 |
| 6,219,294 B1 * | 4/2001 | Huber et al. | 365/226 |
| 6,232,793 B1 | 5/2001 | Arimoto et al. | |
| 6,232,893 B1 | 5/2001 | Cliff et al. | |
| 6,275,439 B1 | 8/2001 | Lee | |
| 6,307,802 B1 | 10/2001 | Manning | |
| 6,317,344 B1 | 11/2001 | Koizumi et al. | |
| 6,359,502 B1 | 3/2002 | Endou | |
| 6,366,513 B1 | 4/2002 | Wang | |
| 6,396,088 B1 | 5/2002 | Kitsukawa et al. | |
| 6,400,595 B1 | 6/2002 | Keeth et al. | |
| 6,424,589 B1 * | 7/2002 | Mochida | 365/230.06 |
| 6,434,076 B1 * | 8/2002 | Andersen et al. | 365/222 |

(Continued)

FOREIGN PATENT DOCUMENTS

JP 411224901 A 8/1999

(Continued)

*Primary Examiner*—Viet Q. Nguyen
(74) *Attorney, Agent, or Firm*—Fish & Neave IP Group

(57) ABSTRACT

A dynamic random access memory (DRAM) is provided that has separate array and peripheral power busing to isolate array noise from peripheral circuits such as delay lock loops during row activations and read/write memory operations. A switch connects the array power bus to another separate power bus for a limited period of time during a DRAM refresh cycle to provide additional current to the DRAM arrays. The switch disconnects the array power bus from the other power bus preferably before the end of the refresh cycle.

20 Claims, 7 Drawing Sheets

U.S. PATENT DOCUMENTS

| | | |
|---|---|---|
| 6,489,597 B1 | 12/2002 | Hornung |
| 6,504,353 B1 * | 1/2003 | Kobayashi et al. ......... 323/314 |
| 6,560,137 B1 * | 5/2003 | Allen et al. .................. 365/145 |
| 6,603,175 B1 | 8/2003 | Kadowaki et al. |
| 6,657,307 B1 | 12/2003 | Iwamoto |
| 6,760,248 B1 * | 7/2004 | Stahl ........................ 365/149 |
| 6,795,365 B1 * | 9/2004 | Raad ......................... 365/226 |
| 6,853,591 B1 * | 2/2005 | Schreck ................. 365/189.07 |
| 6,888,767 B1 * | 5/2005 | Han ........................... 365/203 |
| 2001/0013075 A1 | 8/2001 | Otsuka et al. |

FOREIGN PATENT DOCUMENTS

JP     2002050955 A     2/2002

* cited by examiner

DRAM POWER BUS CONTROL

CROSS REFERENCE TO RELATED APPLICATION

This is a division of U.S. patent application Ser. No. 10/227,468, filed Aug. 23, 2002, now U.S. Pat. No. 6,795,365, which is hereby incorporated by reference herein in its entirety.

BACKGROUND OF THE INVENTION

This invention relates to dynamic random access memories (DRAMs). More particularly, this invention relates to power distribution on DRAMs.

A DRAM is a form of semiconductor random access memory (RAM) commonly used as main memory in computers and other electronic systems. DRAMs store information in arrays of integrated circuits that include capacitors. Because capacitors lose their charge over time, they need to be regularly recharged. This regular recharging is performed during "refresh" cycles.

DRAMs also include other circuits and devices, known as peripherals, that support memory read and write operations as well as other DRAM functions. High speed DRAMs, known as synchronous DRAMs (SDRAMs), use clocks to synchronize control and data signal transfers and include peripherals known as delay lock loop (DLL) circuits to maintain that synchronization.

DLL circuits, however, are susceptible to power and ground bus noise typically generated by the memory arrays during row activations and data reads and writes. This susceptibility can cause the DRAM to lose synchronization. Loss of synchronization causes timing problems that can result in the wrong data being read from or written to memory, thus adversely affecting data integrity throughout a computer or other system.

One known solution is to isolate the power and ground buses connected to the DLL and other synchronization control circuits from the power and ground buses connected to the DRAM arrays. This can be done by running separate power and ground buses to peripheral circuits from one set of chip power and ground input/output (I/O) pads and running separate power and ground buses to the arrays from another set of chip power and ground I/O pads. Each chip power and ground pad is connected to an external voltage. Thus, rather than have a network of power and ground buses commonly connected to all respective power and ground pads, separate and isolated power and ground buses are connected to respective subsets of the DRAM chip's power and ground pads.

Such power distribution, however, results in less available current per separate power bus, because each bus has fewer pads connected to it from which to draw current. Each power pad can supply only a limited amount of current. This can adversely affect the DRAM arrays during refresh cycles when significantly increased amounts of current are needed to recharge the capacitors. With less current available, the capacitors may not fully charge. This can decrease the time that a capacitor retains the correct stored value, thus resulting in either a loss of stored data or more frequent refresh cycles. More frequent refresh cycles result in reduced DRAM performance, because read/write operations cannot be performed during refresh cycles.

In view of the foregoing, it would be desirable to provide synchronization control circuits with power and ground busing having inconsequential, if any, noise generated by memory arrays during row activations and read/write operations while still providing the arrays with sufficient current during refresh cycles.

SUMMARY OF THE INVENTION

It is an object of this invention to provide synchronization control circuits with power and ground busing having inconsequential, if any, noise generated by memory arrays during row activations and read/write operations while still providing the arrays with sufficient current during refresh cycles.

In accordance with this invention, power distribution on DRAM chips is provided such that DLL and other peripheral circuits are supplied with power and ground substantially free of any noise generated by array row activations and read/write operations. This power and ground is supplied via dedicated power and ground pads not used by the arrays during non-refresh operations. The DRAM power distribution also supplies sufficient current to the arrays during refresh cycles via a switchable connection between array power busing and power busing connected to one or more power pads also not used by the arrays during non-refresh operations.

In a preferred embodiment of the invention, a DRAM chip has array power buses that provide a regulated voltage to the arrays, peripheral power buses that provide a regulated voltage to DLL and other peripheral circuits, and a third power bus that provides an unregulated voltage to still other peripheral circuits. The peripheral and third power buses are connected to one or more power pads other than the power pads connected to the array power buses. The power pads connected to the peripheral and third power buses can be the same. Preferably, the unregulated voltage provided by the third power bus is higher than the regulated voltages provided by the array and peripheral power buses. The DRAM chip further includes a switch that connects the array power bus to the third power bus. The switch closes for a finite period of time preferably at the start of each refresh cycle to provide additional current to the arrays. The switch opens preferably well before or at least by the end of the refresh cycle.

In a more preferred embodiment of the invention, the switch is a p-channel FET (field effect transistor) with its source connected to the third power bus and its drain connected to the array power bus. A signal pulse applied to the FET's gate turns it ON (i.e., renders it conductive) for a momentary period of time preferably at the start of each refresh cycle. The third power bus then supplies needed current through the conductive p-channel FET to the DRAM arrays. The DLL and other peripheral circuits are not affected by this because no reading or writing of data occurs during refresh cycles, thus the temporary connection between the array and third power bus has no adverse affect on synchronization or data integrity.

The invention advantageously provides DLL and other peripheral circuits with noise isolation during DRAM row activations and data reads and writes while providing increased current during at least a portion of each DRAM array refresh cycle.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
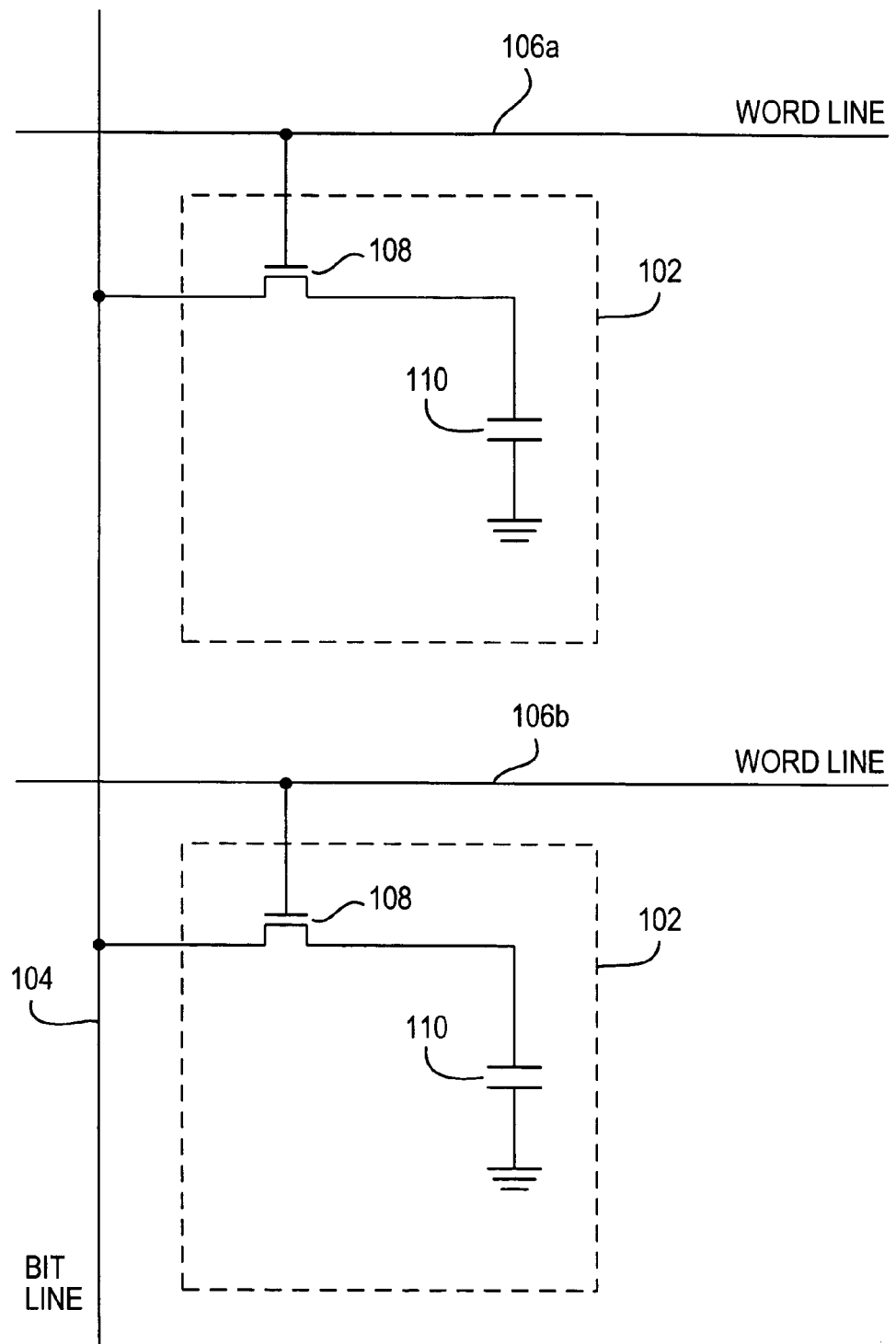
FIG. 1 is a circuit diagram of a pair of DRAM cells.

DRAMs are, in their simplest form, arrays of cells each including a capacitor for holding a charge and a transistor acting as a switch for accessing the charge held in the capacitor. DRAM arrays are typically arranged in columns and rows. FIG. 1 shows a pair of DRAM cells 102. Each cell 102 is connected to a bit line 104 and a respective word line 106a or 106b that controls the ON/OFF state of transistor 108. Bit line 104 is used to write information to or read information from capacitor 110 when the signal on word line 106a or 106b turns transistor 108 ON (i.e., renders the transistor conductive).

A DRAM chip is a sophisticated device that can be thought of as having two portions: the array, which includes a plurality of individual memory cells for storing data, and the peripherals, which include all of the circuits needed to write information into and read information out of the array and to support the other functions of the chip.

Figure 2:
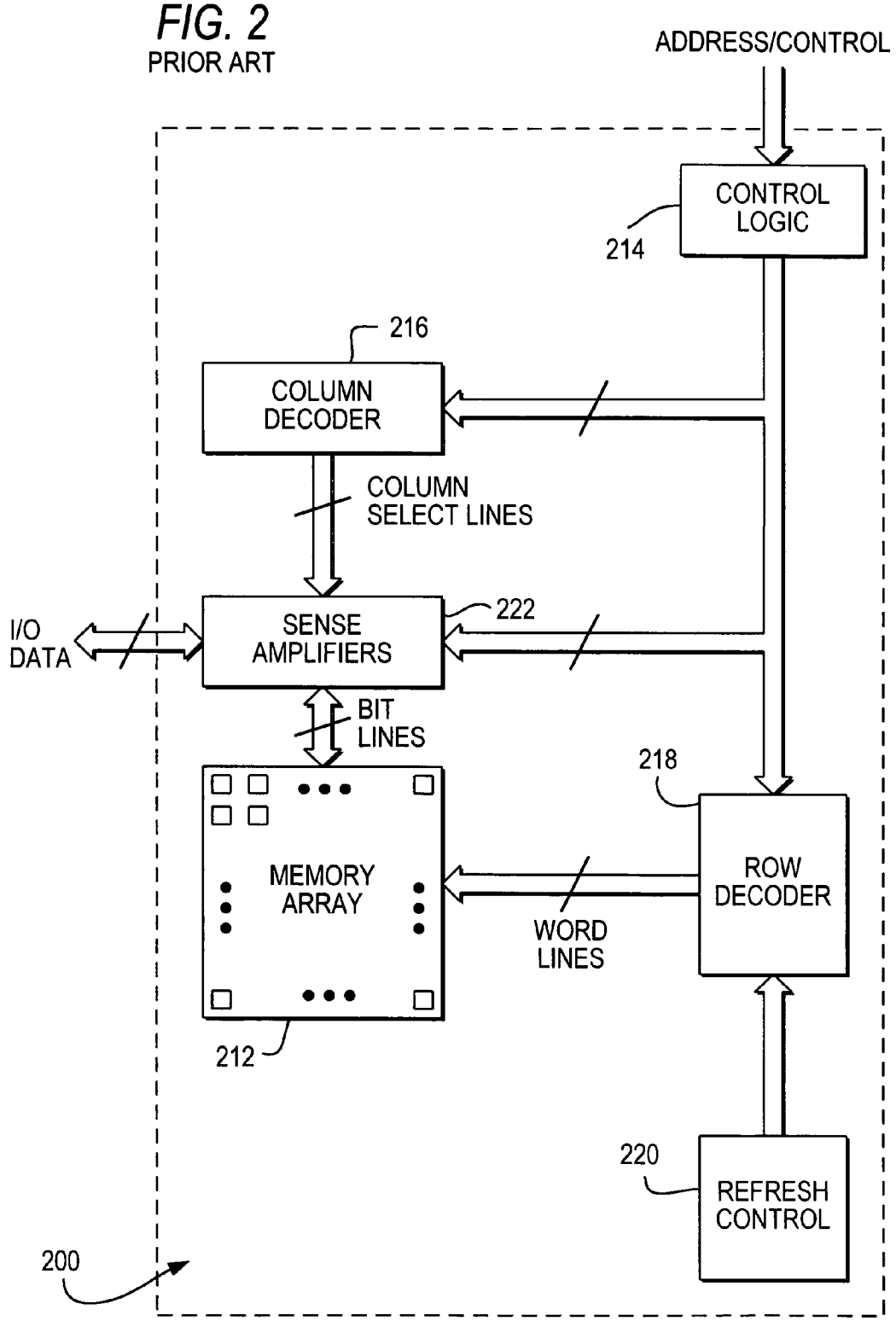
FIG. 2 is a block diagram of a DRAM chip.

FIG. 2 shows generally the functions on a DRAM chip. DRAM chip 200 includes a memory array 212, read/write control logic 214, column decoder 216, row decoder 218, refresh control logic 220, and sense amplifiers 222. Other peripherals (not shown in FIG. 2 to maintain clarity) include input and output data and address buffers, voltage regulators, redundancy circuits, test logic, and electrostatic discharge (ESD) devices. DRAM chip 200 also includes (also not shown in FIG. 2 for clarity) a plurality of data I/O pads, a plurality of power I/O pads, a plurality of ground I/O pads, power busing, and ground busing.

DRAMs require continuous power in order to retain their stored contents. If power to the DRAM is removed, all contents are lost. Furthermore, because capacitors normally discharge over time, DRAMs also require periodic refreshing to prevent loss of stored data. Refreshing of memory contents is usually carried out row by row via refresh control logic 220. Refresh operations lead to high current consumption. Moreover, refresh rates can cause the power needed to vary greatly. Providing the necessary power may result in noise and other undesirable side effects when maximum power is not required, such as during normal read/write operations. In high speed SDRAMs (synchronous DRAMs), refresh rates of about 512 Meg per about 8 µsec are known.

There are typically two types of refresh modes: AUTO refresh and SELF refresh. AUTO refresh mode is typically used during normal operation of the computer or other electronic system that incorporates the DRAM. SELF refresh mode is typically used when the computer or other electronic system goes into a sleep or low power mode (which still provides power to the DRAM).

Note that while the arrays are being refreshed, read and write operations cannot be performed. If reads or writes are pending at the start of a refresh cycle, one or more wait states occur until the refresh cycle completes.

Sense amplifiers 222 are the first element of the data read path and the last element of the data write path. A sense amplifier 222 detects and restores the capacitor voltage representing a data bit to its appropriate value. This is done by first transferring the data bit from the capacitor of a memory cell to its associated bit line, measuring the potential difference between the activated bit line and a reference line which may be an inactive bit line, and then adding or subtracting voltage as needed. Sense amplifiers 222 thus sense and amplify the state of data (i.e., a logical "1" or logical "0"). When a sense amplifier 222 "fires" (i.e., becomes active), a large current drain occurs that causes power spikes on the power and ground buses.

To improve the performance of a DRAM (i.e., the speed with which reads and writes are made), a clock is used to control the transfer of data and control signals within and to and from the DRAM. To improve performance further, data and control signal transfers occur at both the leading and trailing edges of the clock signal. DRAMS operating in this manner are known as a DDR (double data rate) SDRAMs.

Such high speed SDRAM operation requires control and data signal synchronization among the various internal SDRAM devices in order that those devices correctly communicate each other. This is accomplished by using one or more reference clock signals and synchronization control circuits, such as DLL circuits. DLL circuits output a delayed clock signal that maintains a specific phase relationship with a reference signal (which is typically the output of an oscillator). The intentionally delayed signal ensures that data setup and hold times of various devices such as flip-flops are met.

DLL circuits are sensitive to power and ground bus noise. Such noise is often generated by row activations and read/write array activity. For example, when a row is activated during a read or write, large power spikes occur on both the power and ground buses. Thus, to insulate DLL and other synchronization control circuits from such noise, separate power and ground buses are provided to those circuits from designated power and ground pads that are not used to power the arrays. Separate power and ground buses are provided to the arrays from other power and ground pads.

Figure 3:
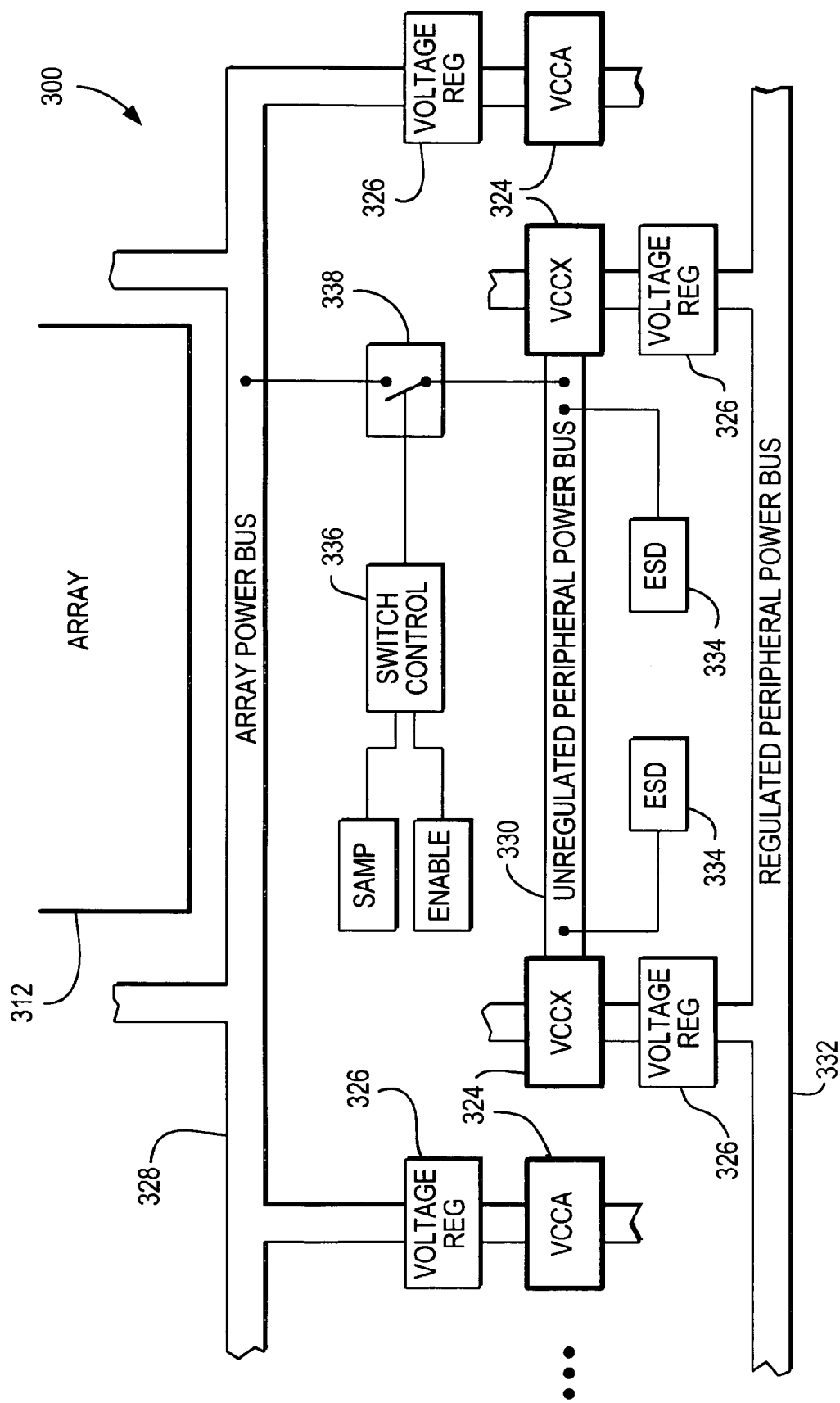
FIG. 3 is a diagram of a portion of a DRAM chip according to the invention.

FIG. 3 shows a portion of a DRAM chip in accordance with the invention. DRAM 300 includes an array 312, power pads 324, voltage regulators 326, array power bus 328, unregulated peripheral power bus 330, regulated peripheral power bus 332, and ESD (electrostatic discharge) devices 334. DRAM 300 also includes ground buses, a number of I/O pads for data and control signals, and DLL and other peripheral circuits, none of which are shown in FIG. 3 for clarity.

Array 312 can be, for example, a 128 Meg array and DRAM 300 can include, for example, four such arrays 312. The number and size of arrays on a DRAM chip can vary, depending on the size of the chip, the desired chip layout, the amount and type of peripherals required, and the technology used to fabricate the arrays and peripheral devices. The invention is not limited to a particular size or number of arrays.

The power, ground, and signal I/O pads are arranged down the center of DRAM 300. However, the invention is not limited to this pad arrangement. Alternatively, for example, pads arranged around the periphery of the chip or in the central region of the chip are also within the scope of the invention. Power and ground pads receive externally supplied voltages for use on the DRAM chip. For example, in one embodiment of the invention, ground pads typically receive about 0 volts while power pads 324 receive about 2.5 volts, which is a common power supply voltage. Note, however, that the invention is not limited to a particular voltage value received at power pads 324.

Voltage regulators 326 are often included in DRAMs to derive a regulated internal supply voltage from the externally provided supply voltage. This internal supply voltage is typically provided to the DRAM's memory cell array and to the array's peripheral control circuits. In the embodiment of the invention mentioned above, the 2.5 volt externally provided supply voltage is regulated to preferably about 1.8 volts by regulators 326. Again, however, the invention is not limited to a particular value of regulated voltage.

Because array activity (e.g., row activations and read and write operations) can produce noise that can affect the operation of the array's peripheral control circuits, particularly the synchronization circuits, individual power pads 324 are dedicated for use by either the array or the peripherals, but not both. Thus, as shown in FIG. 3, some power pads 324 are dedicated for powering array 312 (denoted VccA) and others are dedicated for powering the peripherals (denoted VccX). Note that the selection and number of pads shown in FIG. 3 dedicated to powering the arrays and to powering the peripherals is merely illustrative. Other numbers and arrangements of array and peripheral powers pads are within the scope of the invention.

Note also that the invention is not limited to each power pad 324 receiving the same voltage. For example, pads dedicated to powering the arrays may receive one voltage while pads dedicated to powering the peripherals may receive another voltage different than the first.

Similarly, note further that the invention is not limited to each voltage regulator 326 regulating the externally provided supply voltage to the same value. For example, voltage regulators regulating voltage from VccA pads may output one regulated voltage while voltage regulators regulating voltage from VccX pads may output another regulated voltage different than the first.

VccA power pads 324 are connected to voltage regulators 326, which are connected to array power bus 328. Array power bus 328 provides regulated voltage to array 312 sufficient to allow array 312 to perform substantially all non-refresh operations, such as array reads and writes. Array power bus 328 may be a single isolated bus connected to the array 312 shown or, alternatively, array power bus 328 may connect to some or all other arrays 312 on DRAM 300 (assuming that DRAM 300 has other arrays) and to some or all other voltage regulators 326 connected to some or all other VccA power pads 324 on DRAM 300.

Vccx power pads 324 are connected to unregulated peripheral power bus 330, which provides the externally received voltage to ESD devices 334.

VccX power pads 324 are also connected to other voltage regulators 326, which are connected to regulated peripheral power bus 332. Regulated peripheral power bus 332 provides regulated voltage to DLL and other synchronization control circuits substantially free of power bus noise caused by non-refresh array 312 activity. Other peripheral circuits, particularly those sensitive to power and ground noise, are preferably also connected to power bus 332, as well as any or all other peripherals as desired or possible in view of chip design constraints and other appropriate considerations. Similar to array power bus 328, regulated peripheral power bus 332 may be a single isolated bus connected to the peripheral circuits associated with the array 312 shown or, alternatively, regulated peripheral power bus 332 may connect to some or all other peripherals associated with some or all other arrays 312 on DRAM 300 (assuming that DRAM 300 has other arrays) and to some or all other voltage regulators 326 connected to some or all other VccX power pads 324 on DRAM 300.

Note that not all VccX power pads 324 on DRAM 300 need to be connected to unregulated peripheral power bus 330, nor do all VccX power pads 324 need to be coupled (via regulators 326) to regulated peripheral power bus 332. Some Vccx power pads 324 may be used exclusively for unregulated power bus 330, while others may be used exclusively for regulated power bus 332, while still others may be used for both.

Preferably, the voltage provided by unregulated peripheral power bus 330 is higher than the voltage provided by regulated peripheral power bus 332. In the embodiment of the invention mentioned above, unregulated power bus 330 provides preferably about 2.5 volts while regulated power bus 332 provides preferably about 1.8 volts.

Thus, in accordance with the invention, VccA power pads 324 do not provide power to DLL and other synchronization circuits, while VccX power pads 324 do not provide power to the array during non-refresh memory operations.

Although not shown, array 312 and the peripherals are also similarly respectively connected to separate ground buses that are connected to respective dedicated ground pads.

Note that the invention is not limited to the particular layout or arrangement of power buses shown. DRAM power buses in accordance with the invention can be of other numbers, on one or more semiconductor chip levels of power busing, and in other suitable arrangements.

Although the DLL and other synchronization circuits are substantially isolated from the adverse effects of power and ground noise generated by the arrays, a disadvantage of having power pads dedicated to only the peripherals is the decreased number of power pads supplying the array with needed current during periods of high current demand, such as refresh cycles. The current-supplying capability of each power pad is limited, and thus, the arrays may not be supplied with current of sufficient magnitude to fully recharge the array cells' capacitors.

To compensate for this possible current deficiency during refresh cycles, DRAM 300 further includes switch control 336 and switch 338 in accordance with the invention. Switch 338 provides a switchable connection between array power bus 328 and unregulated peripheral power bus 330. Switch 338 is coupled to array power bus 328 preferably equidistantly between array power bus voltage regulators 326. During non-refresh array operations, switch 338 remains open, isolating array power bus 328 from unregulated peripheral power bus 330. Preferably at the start of each refresh operation, switch control 326 generates a signal pulse that closes switch 338 for a limited period of time preferably much less than the duration of the refresh cycle. Switch 338 preferably closes during activation of the sense amplifiers. The length of time that switch 338 should remain closed in accordance with the invention depends on the array current load and the current handling capacity of switch 338. The array current load can vary depending on, for example, digit line capacitance, array voltage, or the number of rows activated. For example, in one embodiment of the invention having a DRAM array of 128 Meg, an array power bus of about 1.8 volts, a peripheral power bus of about 2.5 volts, and a switch 338 having a current handling capacity of about 25 mA, a switch 338 closure time of about 10–12 nsec is sufficient to provide the array with additional needed current.

Switch control 336 preferably receives signals SAMP and ENABLE (in both AUTO and SELF refresh modes). Signal ENABLE can be received from, for example, refresh control 220 and indicates the start of a refresh cycle. Signal SAMP is received preferably just as one of sense amplifiers 222 is about to fire in connection with that refresh cycle.

This temporary connection between array power bus 328 and peripheral power bus 330 provides the arrays with additional current during a refresh cycle. The DLL and other synchronization circuits are not affected by this temporary "shorting" of the two power buses because no reads or writes are performed during refresh, and thus no synchronization of data and control signal transfers is required. The limited duration of the temporary power bus connection provided by switch 338 preferably dampens out the current spike typically seen on the array power bus during refresh.

Thus, in accordance with the invention, neither array power pads 324 nor array power bus 328 is directly connected on DRAM 300 to either peripheral power pads 324, unregulated peripheral power bus 330, or regulated peripheral power bus 332 other than as described with respect to switch 338 during refresh operations.

Figure 4:
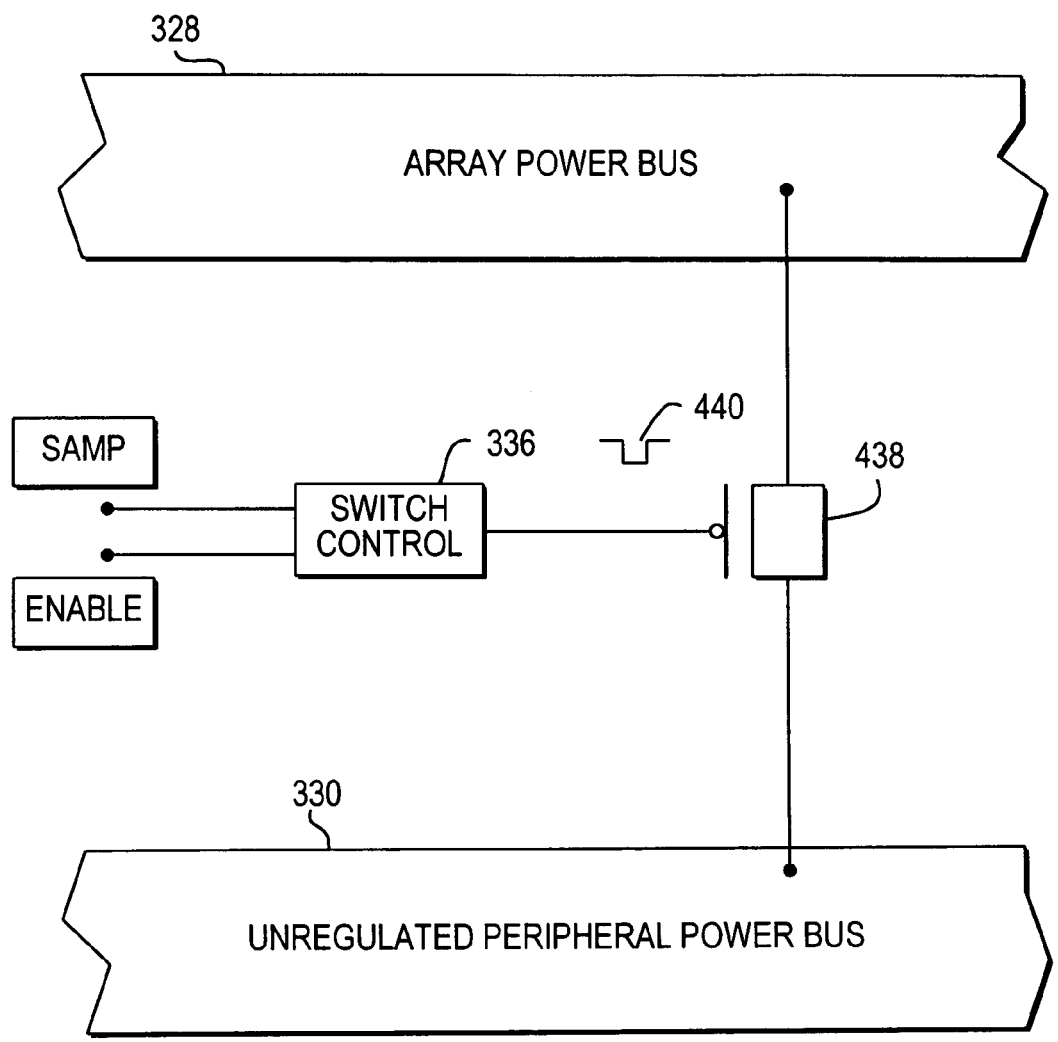
FIG. 4 is a diagram of an exemplary embodiment of a power bus switch according to the invention.

FIG. 4 shows an exemplary embodiment of a switch in accordance with the invention. Switch 438 is preferably a field-effect transistor (FET), and is more preferably a p-channel FET. The gate of p-channel FET 438 is driven by a signal pulse 440 from switch control 336. During array reads and writes, p-channel FET 438 is OFF (i.e., it does not conduct) and no conduction occurs between array power bus 328 and unregulated peripheral power bus 330. At the start of a refresh cycle, the p-channel device receives a logical "0" signal pulse 440 from switch control 336, which turns p-channel FET 438 ON (i.e., it conducts). This connects the 2.5 volt peripheral power bus to the 1.8 volt array power bus, providing the arrays with additional current during a portion of the refresh cycle.

The p-channel device is sized to handle the current flow from peripheral power bus 330 to array power bus 328. In an embodiment of the invention having the following: a DRAM array of 128 Meg, an array power bus of about 1.8 volts, and a peripheral power bus of about 2.5 volts, p-channel FET 438 has a width of preferably about 750 microns and a length of about 1.2 microns. Channels of wider widths are usually preferable, and as is known in the art, p-channel FET 438 can be of other sizes in accordance with current-handling requirements and fabrication technology constraints and considerations.

Alternatively, switch 338 can be other appropriate devices. For example, switch 338 can be an appropriately sized n-channel device. In general, the switch can also be any known device that can be activated (i.e., closed) for a finite period of time by a signal pulse or equivalent means and that can handle current flow from the 2.5 volt bus to the 1.8 volt bus for that finite period of time during the refresh cycle.

Figure 5:
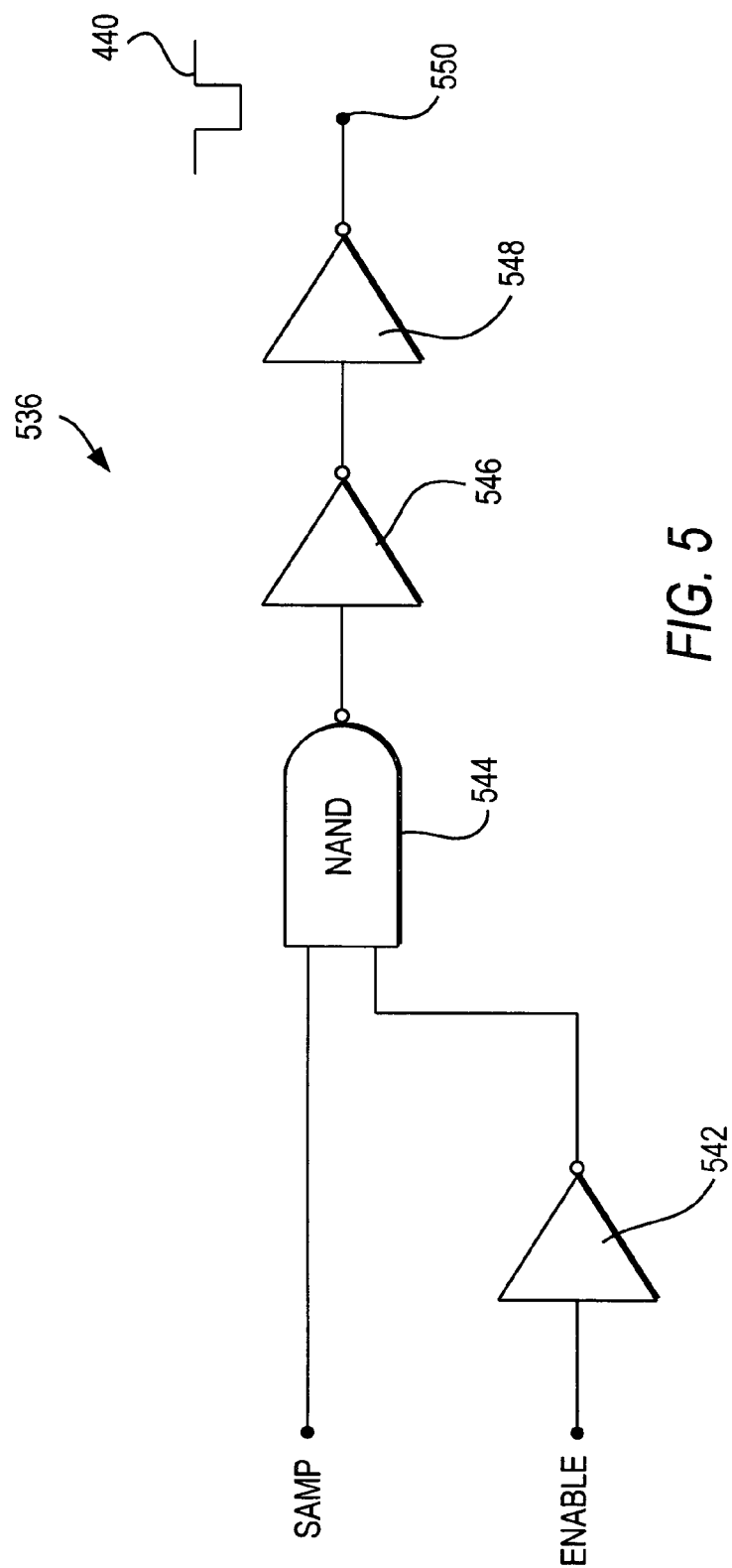
FIG. 5 is a circuit diagram of an exemplary embodiment of switch control circuitry according to the invention.

FIG. 5 shows an exemplary embodiment of switch control circuitry in accordance with the invention. Switch control 536 includes NAND gate 544 and inverters 542, 546, and 548. Inverter 542 receives an ENABLE signal as input, and NAND gate 544 receives an SAMP signal and the output of inverter 542 as inputs. The ENABLE signal enables switch control 536 via a logical 0 substantially upon the start of a refresh cycle. The ENABLE signal may be generated by, for example, refresh control logic 220 (FIG. 2) or by any other suitable source associated with DRAM refresh operations either on the DRAM chip or received by the DRAM chip. The SAMP signal preferably indicates via a logical 1 pulse that a sense amplifier is about to fire. Similarly, the SAMP signal may be generated by, for example, refresh control logic 220 (FIG. 2) or by any other suitable source associated with the firing of sense amplifiers during DRAM refresh operations. This source may be either on the DRAM chip or received by the DRAM chip. The width of the SAMP logical 1 signal pulse determines the width of the output signal pulse at output node 550 (i.e., signal pulse 440), and thus the period of time that the switch allows conduction between array power bus 328 and peripheral power bus 330. Output node 550 is coupled to at least one switch 338 or 438, and preferably switch control 536 can drive more than one switch 338 or 438.

Figure 6:
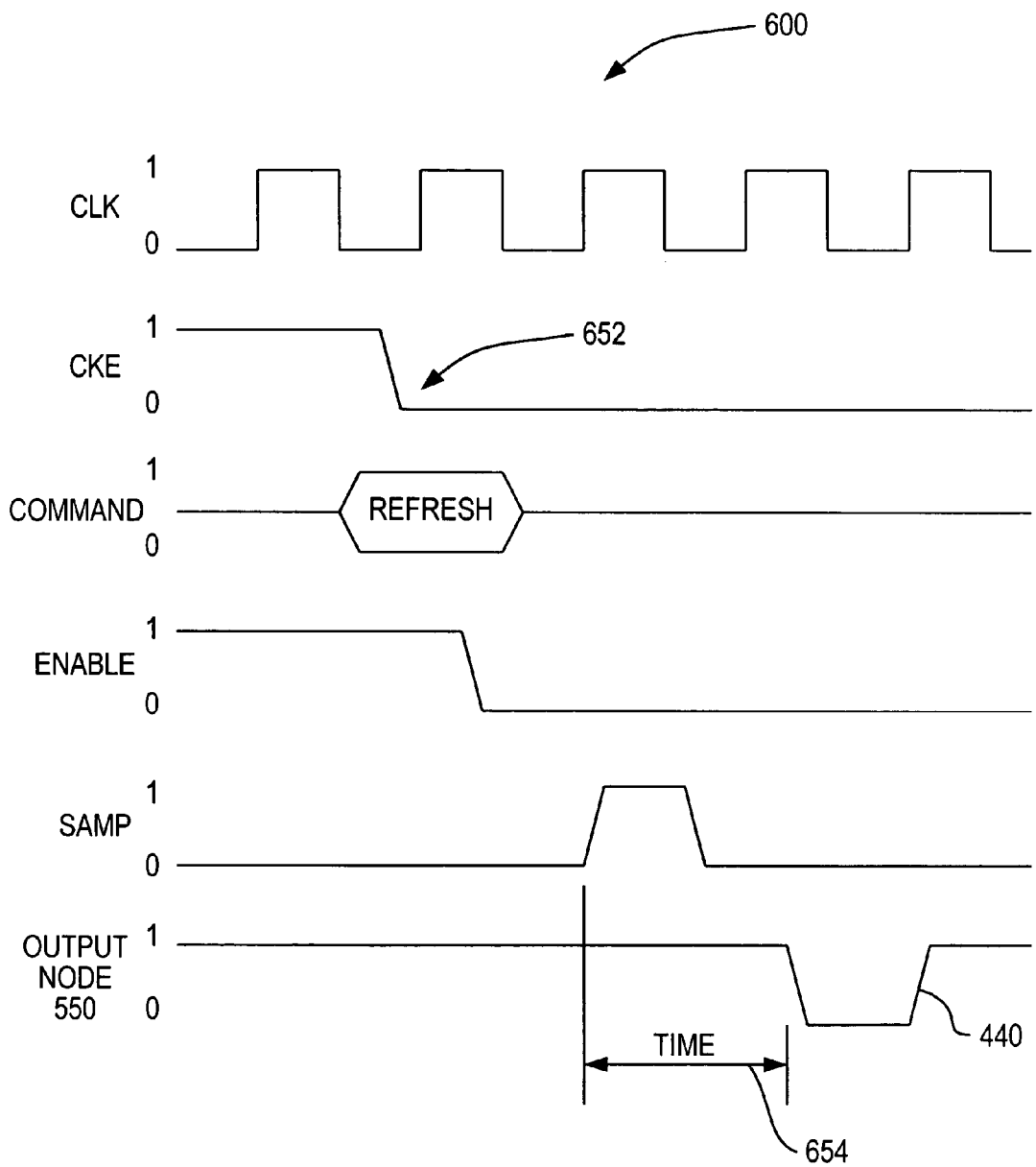
FIG. 6 is a timing diagram of an exemplary embodiment of switch control input and output signals according to the invention.

FIG. 6 shows a timing diagram 600 of an embodiment of DRAM signals and the generation of a signal pulse 440 associated with a SELF refresh operation in accordance with the invention. Signal CLK is a system clock signal, signal CKE is a DRAM clock enable signal that allows SELF refresh mode to execute asynchronously to the system clock, and signal COMMAND is a refresh command signal. The DRAM enters SELF refresh mode when signal CKE switches as shown at signal transition 652 and exits self-refresh mode when signal CKE switches again. Time 654 represents the propagation delay through switch control 536. The same relative timings as shown in FIG. 6 also occur in AUTO refresh mode, except that signal CKE remains at logical 1.

Note that switch control 536 and timing diagram 600 are both merely illustrative. Other switch control circuits that can produce signal pulses similar to or the same as signal pulse 440 in connection with a refresh operation can also be used. For example, in another embodiment of switch control circuitry, inverter 542 can be replaced with a non-inverting delay block (comprising any suitable logic circuit) and the ENABLE signal can be replaced with a logically complementary signal. Similarly, in still another embodiment of switch control circuitry, inverters 546 and 548 can be replaced with a non-inverting delay block having a propagation delay substantially the same as the combined delay through inverters 546 and 548.

The number of switches (and associated switch controls 336) implemented on a DRAM chip can vary depending on, for example, the size and organization of the arrays and power buses on the chip, the current handling capability of each switch, the amount of current required for refresh operations and the amount of current available for the array power busing, and the chip space available and its location relative to the arrays and power buses. The number of switches implemented on a DRAM chip may additionally or alternatively depend on other considerations as well.

Figure 7:
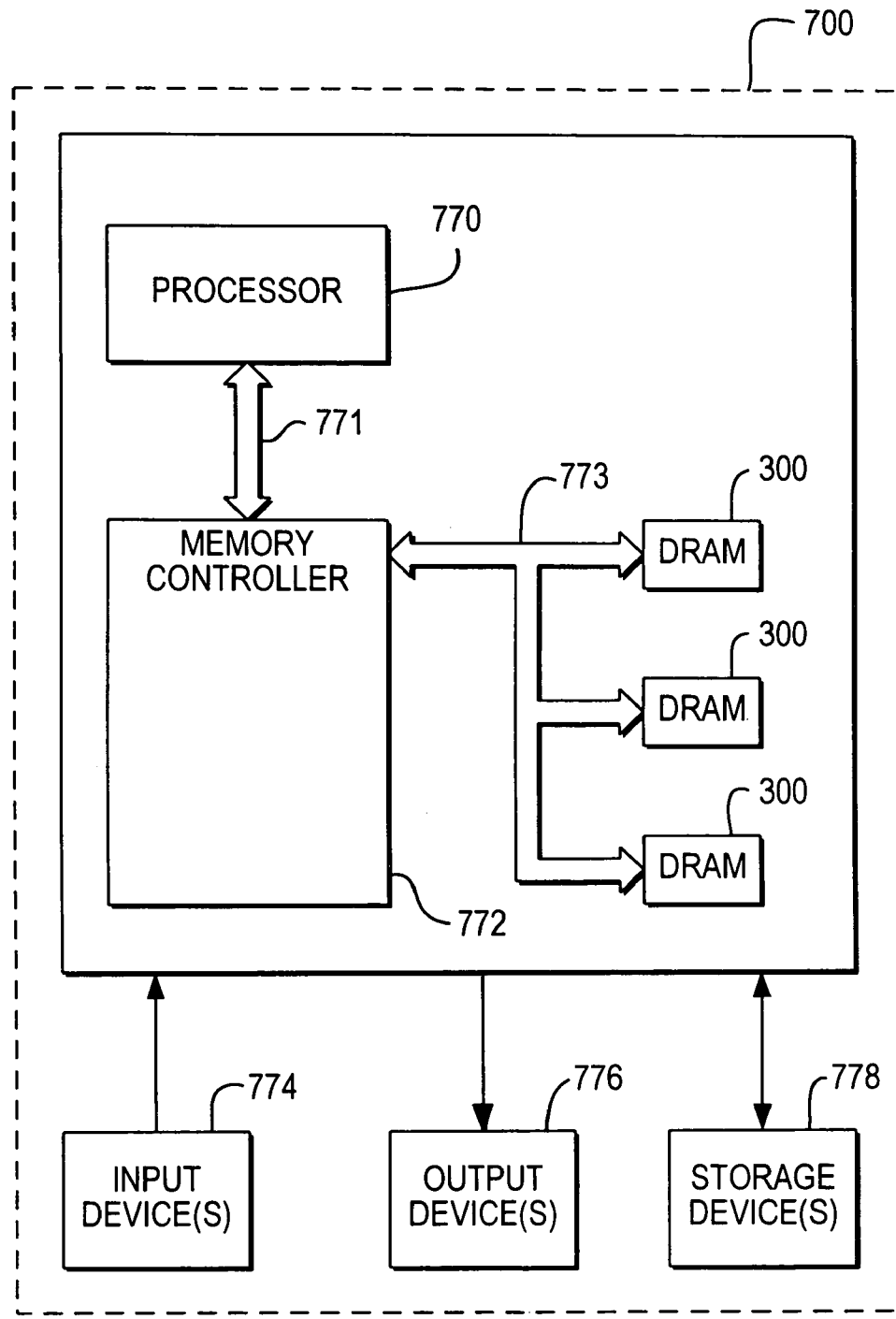
FIG. 7 is a block diagram of a system that incorporates the invention.

FIG. 7 shows a system that incorporates the invention. System 700 includes a plurality of DRAM chips 300, a processor 770, a memory controller 772, input devices 774, output devices 776, and optional storage devices 778. Data and control signals are transferred between processor 770 and memory controller 772 via bus 771. Similarly, data and control signals are transferred between memory controller 772 and DRAM chips 300 via bus 773. Input devices 774 can include, for example, a keyboard, a mouse, a touch-pad display screen, or any other appropriate device that allows a user to enter information into system 700. Output devices 776 can include, for example, a video display unit, a printer, or any other appropriate device capable of providing output data to a user. Note that input devices 774 and output devices 776 can alternatively be a single input/output device. Storage devices 778 can include, for example, one or more disk or tape drives.

Note that the invention is not limited to DRAM chips, but is applicable to other integrated circuit chips having a circuit or group of circuits sensitive to power or ground noise generated by a second circuit or group of circuits in which the second circuit or group also requires temporary increases in current for periodically or occasionally performed functions or operations.

Thus it is seen that DRAM power bus control is provided to isolate peripheral circuits from power bus noise generated by memory arrays during reads and writes, while still providing the arrays with sufficient current during refresh cycles. One skilled in the art will appreciate that the invention can be practiced by other than the described embodiments, which are presented for purposes of illustration and not of limitation, and the invention is limited only by the claims which follow.

I claim:

1. A method of controlling power distribution on an integrated circuit chip having dynamic random access memory, said dynamic random access memory comprising at least one array operative to be read from and written to and being periodically refreshed in order to maintain stored values, said chip further having non-dynamic random access memory circuits, said method comprising:
   powering at least some said non-dynamic random access memory circuits with a first power bus;
   powering reads and writes of said array with a second power bus, said second power bus not coupled to said first power bus; and
   coupling said second power bus to a third power bus for a finite period of time during said periodic refreshing of said array.

2. The method of claim 1 further comprising regulating voltage on said second power bus.

3. The method of claim 1 further comprising:
   coupling said first power bus to a first integrated circuit chip power pad; and
   coupling said second power bus to a second integrated circuit chip power pad.

4. The method of claim 3 further comprising coupling said third power bus to said first integrated circuit chip power pad.

5. The method of claim 4 further comprising regulating voltage on said first power bus.

6. The method of claim 1 wherein said third power bus has a higher voltage than said second power bus.

7. The method of claim 1 wherein said coupling comprises coupling said second power bus to an unregulated third power bus for a finite period of time during said periodic refreshing of said array.

8. The method of claim 1 further comprising before said coupling:
   refreshing said dynamic random access memory in order to maintain stored values; and after said coupling:
   de-coupling said second power bus from said third power bus prior to completion of said refreshing.

9. The method of claim 1 further comprising powering an electrostatic discharge device with said third power bus.

10. The method of claim 1 wherein said non-dynamic random access memory circuits include synchronization circuits.

11. Apparatus for controlling power distribution on an integrated circuit chip having dynamic random access memory, said dynamic random access memory comprising at least one array operative to be read from and written to and being periodically refreshed in order to maintain stored values, said chip further having non-dynamic random access memory circuits, said apparatus comprising:
   means for powering at least some said non-dynamic random access memory circuits;
   means for powering reads and writes of said array, said means for powering reads and writes different from said means for powering at least some said non-dynamic random access memory circuits; and
   means for increasing power of said means for powering reads and writes for a finite period of time during said periodic refreshing of said array.

12. The apparatus of claim 11 further comprising means for regulating voltage provided by said means for powering reads and writes.

13. A method for controlling power distribution on an integrated circuit chip having dynamic random access memory, said dynamic random access memory comprising at least one array operative to be read from and written to and being periodically refreshed in order to maintain stored values, said chip further having non-dynamic random access memory circuits, said method comprising:
   powering at least some said non-dynamic random access memory circuits with a first voltage;
   powering reads and writes of said array with a second voltage; and
   powering reads and writes for a finite period of time during said periodic refreshing of said array with a third voltage, wherein said third voltage is higher than said second voltage.

14. The method of claim 13 further comprising at least one of:
   regulating said first voltage; and
   regulating said second voltage.

15. The method of claim 13 wherein said first voltage and said second voltage are different.

16. The method of claim 13 further comprising:
   receiving said first voltage from a first integrated circuit chip power pad; and
   receiving said second voltage from a second integrated circuit chip power pad.

17. The method of claim 16 further comprising receiving said third voltage from said second integrated circuit chip power pad and a third integrated circuit chip power pad for said finite period of time during said periodic refreshing of said array.

18. The method of claim 16 further comprising receiving said third voltage from said first integrated circuit chip power pad and said second integrated circuit chip power pad for said finite period of time during said periodic refreshing of said array.

19. The method of claim 13 wherein before said powering reads and writes for a finite period of time:
   refreshing said dynamic random access memory in order to maintain stored values; and after said powering reads and writes for a finite period of time:
   powering reads and writes of said array with said second voltage prior to completion of said refreshing.

20. The method of claim 13 further comprising powering an electrostatic discharge device with said second voltage.

* * * * *